(12) United States Patent
Hsueh et al.

(10) Patent No.: US 9,029,192 B1
(45) Date of Patent: May 12, 2015

(54) METAL ORGANIC CHEMICAL VAPOR DEPOSITION OF RESISTIVE SWITCHING LAYERS FOR RERAM CELLS

(71) Applicant: Intermolecular Inc., San Jose, CA (US)

(72) Inventors: Chien-Lan Hsueh, Campbell, CA (US); Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 6 days.

(21) Appl. No.: 14/135,765

(22) Filed: Dec. 20, 2013

(51) Int. Cl.
   *H01L 21/00* (2006.01)
   *H01L 21/16* (2006.01)
   *H01L 45/00* (2006.01)

(52) U.S. Cl.
   CPC .................. *H01L 45/1616* (2013.01)

(58) Field of Classification Search
   USPC .......................................................... 438/104
   See application file for complete search history.

(56) References Cited

U.S. PATENT DOCUMENTS

| | | | |
|---|---|---|---|
| 7,208,372 B2 | 4/2007 | Hsu | |
| 8,426,841 B2 * | 4/2013 | Seo et al. | 257/4 |
| 2004/0085833 A1 * | 5/2004 | Hwang et al. | 365/200 |
| 2004/0264244 A1 * | 12/2004 | Morimoto | 365/180 |
| 2010/0225438 A1 * | 9/2010 | Wei et al. | 338/20 |
| 2011/0037043 A1 * | 2/2011 | Wada | 257/2 |

OTHER PUBLICATIONS

Lee et al.; Resistance Switching Behaviors of Hafnium Oxide Films Grown by MOCVD for Nonvolatile Memory Applications; Dec. 6, 2007; Pohang Institute of Science and Technology. Korea; Journal of the Electrochemical Society Dec. 6, 2007 pp. H92H96 vol. 155 2.
Song et al.; Growth of Hafnium Aluminate Thin Films by Direct Liquid Injection Metallorganic CVD Using Hf [NC2H52]4 and AlOlC3H73; Jan. 1, 2005; Journal of the Electrochemical Society.
Tsuchiya et al.; PulsedSource MOCVD of Highk Dielectric Thin Films with in situ Monitoring by Spectroscopic Ellipsometry; Apr. 1, 2003; The Japan Society of Applied Physics.

* cited by examiner

*Primary Examiner* — Karen Kusumakar (57) ABSTRACT

Provided are resistive random access memory (ReRAM) cells and methods of fabricating thereof using metal organic chemical vapor deposition (MOCVD). Specifically, the MOCVD is used to form a resistive switching layer including oxides of at least two elements. The resistive switching layer may have a variable composition throughout its thickness, which may be achieved by dynamically varying flow rates of metal organic precursors during MOCVD of the resistive switching layer. In some embodiments, the first element may be a transition metal, while the second element may be a component forming an insulating oxide. The second element may be concentrated in the middle of the resistive switching layer between its bottom and top sides and may not be present at either one of these sides. Such distribution of materials allows controlling the size and composition of a switching zone within the resistive switching layer and reducing power needed for switching.

19 Claims, 6 Drawing Sheets

METAL ORGANIC CHEMICAL VAPOR DEPOSITION OF RESISTIVE SWITCHING LAYERS FOR RERAM CELLS

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are resistive random access memory (ReRAM) cells and methods of fabricating thereof using metal organic chemical vapor deposition (MOCVD). Specifically, the MOCD is used to form a resistive switching layer including oxides of at least two elements. The resistive switching layer has a variable composition throughout its thickness, which may be achieved by dynamically varying flow rates of metal organic precursors during MOCVD of the resistive switching layer. In some embodiments, the first element may be a transition metal, while the second element may be a component forming an insulating oxide. The second element may be concentrated in the middle of the resistive switching layer between its bottom and top sides. In some embodiments, the second element may not be present at either one of these sides. Such distribution of materials allows controlling the size and composition of the switching zone within the resistive switching layer. It also allows reducing the power needed for switching.

In some embodiments, a method of fabricating a ReRAM cell involves providing a substrate including a conductive layer. The conductive layer may be operable as an electrode. The method proceeds with forming a resistive switching layer over the first conductive layer. The resistive switching layer is formed by techniques that include MOCVD. The first layer and includes a first element, a second element different from the first element, and oxygen. Both elements may be in the form of oxides. As such, the resistive switching layer may include a combination of a first metal oxide formed by the first element and a second metal oxide formed by the second element. Both oxides may be formed using MOCVD.

In some embodiments, the concentration of the first element varies throughout the thickness of the resistive switching layer, such as between the top and bottom sides of the layer. The concentration of the first element may be the lowest away from top and bottom sides of the resistive switching layer. For example, the concentration of the first element may be the lowest in the middle of the resistive switching layer. The concentration of the second element may also vary throughout the thickness of the resistive switching layer. In some embodiments, the concentration of the second element is the highest in the resistive switching layer at a location where the concentration of the first element is lowest. For example, the concentration of the second element may be the highest in the middle of the resistive switching layer. An atomic ratio of the second element to a combination of the first element and the second element in the resistive switching layer may be between about 10% and 20%. In some embodiments, the concentration of the second element at top and bottom sides of the resistive switching layer is about 0% atomic. The second element may be present only in less than about 50% of the resistive switching layer along a thickness of the resistive switching layer.

The first element may be a transition metal, such as hafnium, tantalum, titanium, zirconium, chromium, nickel, or cobalt. The second element forms an insulating oxide. The second element may be one of aluminum, silicon, germanium, sulfur, selenium, or gallium. As such, the resistive switching layer may include one of hafnium silicon oxide, hafnium aluminum oxide, tantalum silicon oxide, or tantalum aluminum oxide. The resistive switching layer may have a thickness of between about 3 nanometers and 5 nanometers.

In some embodiments, forming the resistive switching layer involves flowing a first metal organic precursor and flowing a second metal organic precursor into a MOCVD chamber. The first metal organic precursor includes the first element. The second metal organic precursor includes the second element. Flow rates of the first metal organic precursor and the second metal organic precursor may be dynamically varied while forming the resistive switching layer. This dynamic variation may be used to achieve a variable concentration of the first and second elements in the resistive switching layer while continuously forming the layer. In some embodiments, forming the resistive switching layer starts and ends with the second metal organic precursor not flowing into the MOCVD chamber. The first metal organic precursor may not flow into the MOCVD chamber for a period time while the second metal organic precursor flows into the MOCVD chamber.

In some embodiments, forming the resistive switching layer also involves flowing an oxidizing agent into the MOCVD chamber. The flow rate of the oxidizing agent may be dynamically varied while forming the resistive switching layer. The flow rate of the oxidizing agent may be reduced when the second metal organic precursor flows into the MOCVD chamber. In some embodiments, the first metal organic precursor and the second metal organic precursor flow into the MOCVD chamber at the same time for at least a period of time while forming the resistive switching layer. In some embodiments, forming the resistive switching layer is performed in a continuous manner. In other words, the substrate is not removed from the MOCVD chamber until the resistive switching layer is formed. Furthermore, one or more precursors may continuously flow into the MOCVD chamber while forming the resistive switching layer. The compositions of these precursors may change while forming the resistive switching layer.

Provided also is a method of fabricating a ReRAM cell that involves providing a substrate. The substrate may include a conductive layer operable as an electrode. The substrate may be at a temperature of between about 300° C. and 450° C. For example, the substrate may be positioned on a heated substrate support in a MOCVD chamber. The process may proceed with forming a resistive switching layer over the first conductive layer. This forming operation may involve flowing tetrakisdiethylamidohafnium and an oxidizing agent into the MOCVD chamber. Thereafter, the forming operation may involve reducing a flow rate of tetrakisdiethylamidohafnium and increasing a flow rate of aluminum isopropoxide. Subsequently, the forming operation may proceed with increasing the flow rate of tetrakisdiethylamidohafnium and stopping the of aluminum isopropoxide.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION OF EXAMPLE EMBODIMENTS

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

INTRODUCTION

A ReRAM cell exhibiting resistive switching characteristics generally includes multiple layers formed into a stack. The stack includes two conductive layers operating as electrodes. These layers may be formed from metals or other conductive materials, such as polysilicon and metal nitrides. The stack also includes an insulator layer disposed between the two electrodes and configured to change its resistive properties when switching voltages are applied to this insulator layer. This layer may be referred to as a variable resistance layer or a resistive switching layer. The changes in the resistive properties are used to store data. For example, one resistive state may be associated with a logic "zero", while the other resistive state may be associated with a logic "one" value.

Without being restricted to any particular theory, changes in resistive properties are believed to be attributed to formation and breaking of conductive paths within resistive switching layers as further described below with reference to FIGS. 1A and 1B. These paths are formed and broken when switching voltages are applied to the layers. The amount of power required to form and break these paths, as well as the stability of these paths, depends on the composition of the resistive switching layer. Furthermore, the composition may vary throughout the thickness of the resistive switching layer. It has been found that concentrating certain components in a defined portion of the resistive switching layer may help reducing the switching power. This portion, which may only be a small part of the layer, is believed to be responsible for switching (formation and break of the conductive paths) and may be referred to as a switching zone.

Conventional processes for fabricating ReRAM cells include atomic layer deposition (ALD) to form, for example, resistive switching layers and physical vapor deposition (PVD) to form, for example, electrodes. However, ALD has a self-limiting nature, while PVD tends to be difficult to control. For example, when a metal oxide is formed, the deposition reaction during ALD will generally produce a stoichiometric oxide if enough oxygen is available to do so. Forming sub-stoichiometric oxides in a controllable manner is difficult with ALD. Yet, sub-stoichiometric oxides may be more suitable for resistive switching layer than their stoichiometric oxide counterparts because of the initial presence of oxygen vacancies, which are believed to be responsible for switching. While multiple workarounds have been proposed when ALD and PVD are used, such as forming nanolaminate stacks in which metal layers are disposed between stoichiometric metal oxide layers, these approaches struggle to achieve desirable composition or, more specifically, desirable distribution of different components within resistive switching layers. Furthermore, ALD and PVD techniques generally have narrow process windows in comparison to MOCVD.

Provided are ReRAM cells and methods of fabricating thereof using MOCVD. Specifically, MOCVD is used to form a resistive switching layer including oxides of two different elements, such as a combination of silicon oxide and hafnium oxide. MOCVD can be used to precisely modulate the composition of the resistive switching layer, such as depositing more silicon oxide in the middle of the resistive switching layer and depositing more hafnium oxide at the sides of the layer. Direct liquid injection (DLI) and/or co-injection may be used for controlling composition. MOCVD allows a direct feed of multiple precursors into the deposition chamber. Furthermore, MOCVD can control the microstructure and texture of the deposited resistive switching layer and provide a good step coverage and uniformity over a large area. The deposition rate of MOCVD is much higher than that of ALD and may be controlled using different temperatures. This feature allows relatively fast processing while depositing resistive switching layers of desired thickness.

Examples of ReRAM Cells and their Switching Mechanisms

A brief description of ReRAM cells is provided for better understanding of various features of resistive switching layers, such as controlling distribution of different metal oxides within the resistive switching layers using MOCVD, as described in this document. A ReRAM cell includes a resistive switching layer formed from a dielectric material exhibiting resistive switching characteristics. A dielectric, which is normally insulating, can be made more conductive when one or more filaments or conduction paths are formed through the layer. The filaments can be formed based on different mechanisms, such as defect migration with the layer when a voltage is applied to the layer. Once the filaments are initially formed, these filaments may be then at least partially broken and reformed by applying switching voltages.

Figure 1A:
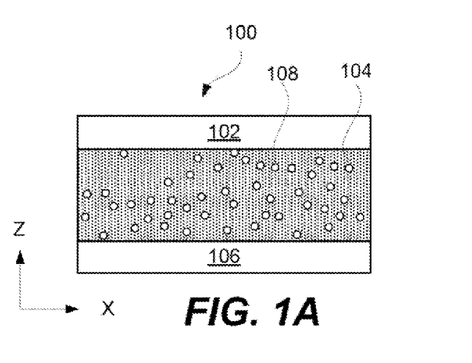
FIGS. 1A and 1B illustrate schematic representations of a ReRAM cell in its high resistive state (HRS) and low resistive state (LRS), in accordance with some embodiments.

FIG. 1A illustrates a schematic representation of ReRAM cell 100 including top electrode 102, bottom electrode 106, and resistive switching layer 104 disposed between top electrode 102 and bottom electrode 106. It should be noted that the "top" and "bottom" references are used solely for differentiation and not to imply any particular spatial orientation of the components. Other references, such as "first" and "second", may be also used identify and distinguish similar components, such as two electrodes, or similar features of the same component, such as two sides of the resistive switching layer.

Resistive switching layer 104 may be initially formed from a dielectric material, such as transition metal oxides and other like materials. Resistive switching layer 104 may be then made to conduct through one or more filaments formed within resistive switching layer 104 by applying a forming voltage or, more specifically, a set of forming pulses. To provide this resistive switching functionality, resistive switching layer 104 may some electrically active defects 108. Electrically active defects 108 may be charge carriers absent from the structure (i.e., vacancies) and/or additional charge carriers introduces into the base material. In some embodiments, electrically active defects 108 may be formed by impurities (i.e., substitutions). These defects may be utilized for ReRAM cells operating according to a valence change mechanism, which may occur in specific transition metal oxides and is triggered by a migration of anions, such as oxygen anions. Migrations of oxygen anions may be represented by the motion of the corresponding vacancies, i.e., oxygen vacancies. A subsequent change of the stoichiometry in the transition metal oxides leads to a redox reaction expressed by a valence change of the cation sub-lattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature.

Figure 1B:
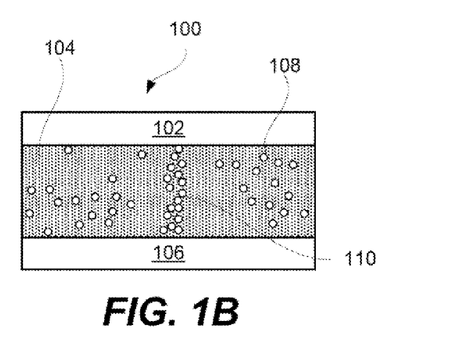

Without being restricted to any particular theory, it is believed that defects 108 can be reoriented within resistive switching layer 104 to form filaments as, for example, schematically shown in FIG. 1B as element 110. This reorientation of defects 108 occurs when a set voltage or a forming voltage is applied to electrodes 102 and 106. Sometimes, reorientation of defects 108 is referred to as "filling the traps" when a set voltage is applied (to form one or more filaments or conduction paths) and "emptying the traps" when a reset voltage is applied (to break the previously formed filaments or conduction paths).

Defects 108 can be introduced into resistive switching layer 104 during or after its fabrication. For example, a concentration of oxygen deficiencies can be introduced into metal oxides during their deposition or during subsequent annealing. The distribution of defects within resistive switching layer 104 determines its switching characteristics. For example, when a high concentration of defects is present and evenly distributed within resistive switching layer 104, conductive filaments can be easily formed and require very little power. However, the power required to break the filaments may be excessive if the defects are overly abundant, because thick or multiple filaments may be formed that are more difficult to break than a single thin filament. Furthermore, a high concentration of defects and a large number of conductive filaments formed may cause rapid drops in the resistance of resistive switching layer 104 and may cause overprogramming. Specifically, the rapid drops in the resistance may cause undesirable current spikes through resistive switching layer 104. On the other hand, insufficient densities of defects can make it difficult to form conductive filaments. Another issue with controlling concentrations and distribution of defects within resistive switching layer 104 is migration of defects within resistive switching layer 104 and between resistive switching layer 104 and other components, such as electrodes. It may be desirable to form resistive switching layer 104 in such a way that conductive filaments are easy to form initially through the entire layer, yet these filaments are then broken and reformed only within a controlled portion of resistive switching layer 104. The controlled portion may be a relatively small portion of the resistive switching layer.

Figure 2:
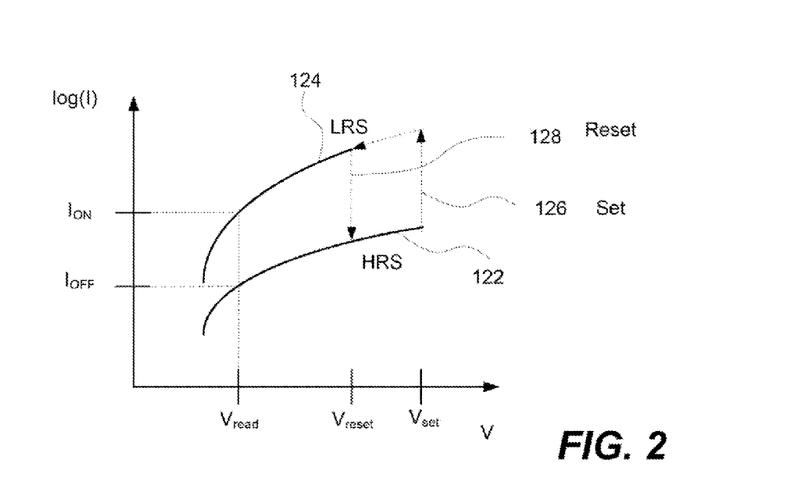
FIG. 2 illustrates a plot of a current passing through a ReRAM cell as a function of a voltage applied to the ReRAM cell, in accordance with some embodiments.

Operation of ReRAM cell 100 will now be briefly described with reference to FIG. 2, which illustrates a logarithmic plot of a current passing through a unipolar ReRAM cell as a function of a voltage applied between the electrodes of the ReRAM cell, in accordance with some embodiments. Similar characteristics are demonstrated by bipolar cells, additional details of which are further presented below. ReRAM cell 100 may be either in a low resistive state (LRS) defined by line 124 or high resistive state (HRS) defined by line 122. Each of these resistive states is used to store a different logic state, e.g., HRS may be read as logic "one" and LRS may be read as logic "zero," or vice versa. Therefore, each ReRAM cell that has two resistive states may be used to store one bit of data. It should be noted that some ReRAM cells may have three and even more resistive states allowing multi-bit storage in the same cell.

HRS and LRS correspond to the presence or absence of one or more filaments or conductive paths in resistive switching layer 104 and of connections between these filaments or conduction paths and the two electrodes 102 and 106. For example, a ReRAM cell may be initially fabricated in LRS and then switched to HRS, or vice versa. A ReRAM cell may be switched back and forth between LRS and HRS many times, defined by set and reset cycles. Furthermore, a ReRAM cell may maintain its LRS or HRS for a substantial period of time and withstand a number of read cycles.

The overall operation of ReRAM cell 100 may be divided into a read operation, set operation (i.e., turning the cell "ON"), and reset operation (i.e., turning the cell "OFF"). Set and reset operations may be referred to as write operations. During the read operation, the state of ReRAM cell 100 (more specifically, the resistive state of resistive switching layer 104) can be sensed by applying a sensing voltage to electrodes 102 and 106. The sensing voltage is sometimes referred to as a "READ" voltage and indicated as $V_{READ}$ in FIG. 2. If ReRAM cell 100 is in HRS represented by line 122, the external read and write circuitry connected to electrodes 102 and 106 will sense the resulting "OFF" current ($I_{OFF}$) that flows through ReRAM cell 100. As stated above, this read operation may be performed multiple times without switching ReRAM cell 100 between HRS and LRS. In the above example, the ReRAM cell 100 should continue to output the "OFF" current ($I_{OFF}$) when the read voltage ($V_{READ}$) is applied to the electrodes.

Continuing with the above example, when it is desired to switch ReRAM cell 100 into a different logic state (corresponding to LRS), ReRAM cell 100 is switched from its HRS to LRS. This operation is referred to as a set operation. This may be accomplished by using the same read and write circuitry to apply a set voltage ($V_{SET}$) to electrodes 102 and 106. Applying the set voltage ($V_{SET}$) forms one or more filaments or conduction paths in resistive switching layer 104 and switches ReRAM cell 100 from its HRS to LRS as indicated by arrow 126. It should be noted that formation or breaking of filaments or conduction paths in resistive switching layer 104 may also involve forming or breaking electrical connections between these filaments and one or both electrodes. The common factor in all these switching mechanisms is passage or blockage of current between the two electrodes.

In LRS, the resistive characteristics of ReRAM cell 100 are represented by line 124. In this LRS, when the read voltage ($V_{READ}$) is applied between electrodes 102 and 106, the external read and write circuitry will sense the resulting "ON" current ($I_{ON}$) that flows through ReRAM cell 100. Again, this read operation may be performed multiple times without switching ReRAM cell 100 between LRS and HRS.

It may be desirable to switch ReRAM cell 100 into a different logic state again by switching ReRAM cell 100 from its LRS to HRS. This operation is referred to as a reset operation, as distinct from the set operation during which ReRAM cell 100 is switched from its HRS to LRS. During the reset operation, a reset voltage ($V_{RESET}$) is applied to ReRAM cell 100 to break the previously formed filaments or conduction paths in resistive switching layer 104, switching ReRAM cell 100 from its LRS to HRS as indicated by arrow 128. Reading of ReRAM cell 100 in its HRS is described above. Overall, ReRAM cell 100 may be switched back and forth between its LRS and HRS many times. Read operations may be performed in each of these states (between the switching operations) one or more times or not performed at all. It should be noted that application of set and reset voltages to change resistive states of the ReRAM cell involves complex mechanisms that, without being bound by theory, are believed to involve localized resistive heating as well as mobility of defects impacted by both temperature and applied potential.

ReRAM cell 100 may be configured to have either unipolar switching or bipolar switching. The unipolar switching does not depend on the polarity of the set voltage ($V_{SET}$) and reset voltage ($V_{RESET}$) applied to the electrodes 102 and 106 and, as a result, to resistive switching layer 104. In the bipolar switching, the set voltage ($V_{SET}$) and reset voltage ($V_{RESET}$) applied to resistive switching layer 104 need to have different polarities.

In some embodiments, the set voltage ($V_{SET}$) is between about 100 mV and 10V or, in some embodiments, between about 500 mV and 5V. The length of set voltage pulses ($t_{SET}$) may be less than about 100 milliseconds, less than about 5 milliseconds, or even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, in some embodiments, greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$).

A ratio of set and reset currents (i.e., an $I_{SET}/I_{RESET}$ ratio) that corresponds to a set voltage ($V_{SET}$) and reset voltage ($V_{RESET}$) may be at least about 5 or, in some embodiments, at least about 10 to make the state of ReRAM cell easier to determine. ReRAM cells should be able to cycle between LRS and HRS at least about $10^3$ times or, in some embodiments, at least about $10^7$ times without failure. A data retention time ($t_{RET}$) should be at least about 5 years or, in some embodiments, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

In some embodiments, the same ReRAM cell may include two or more resistive switching layers interconnected in series. Pairs of resistive switching layers may directly contact each other, or they may be separated by one or more intermediate layers.

In some embodiments, a ReRAM cell is subjected to a forming operation, during which the initially insulating properties of the resistive switching layer are altered and the ReRAM cell is configured into the initial LRS or HRS. The forming operation may include a very short high discharge current peak associated with a forming voltage. The LRS level of the resistive switching layer for subsequent switching is determined by the filaments or connections created by the forming operation. If the forming operation makes the resistive-switching layer too conductive, the cell may be difficult to reset. In this case, a resistive switching layer with very low levels of resistance in the LRS may be limited in terms of scaling down. This difficulty may be resolved by positioning such resistive switching layers in series with other components providing additional resistance to the overall ReRAM cell.

Examples of ReRAM Cells Having Embedded Resistors

Figure 3A:
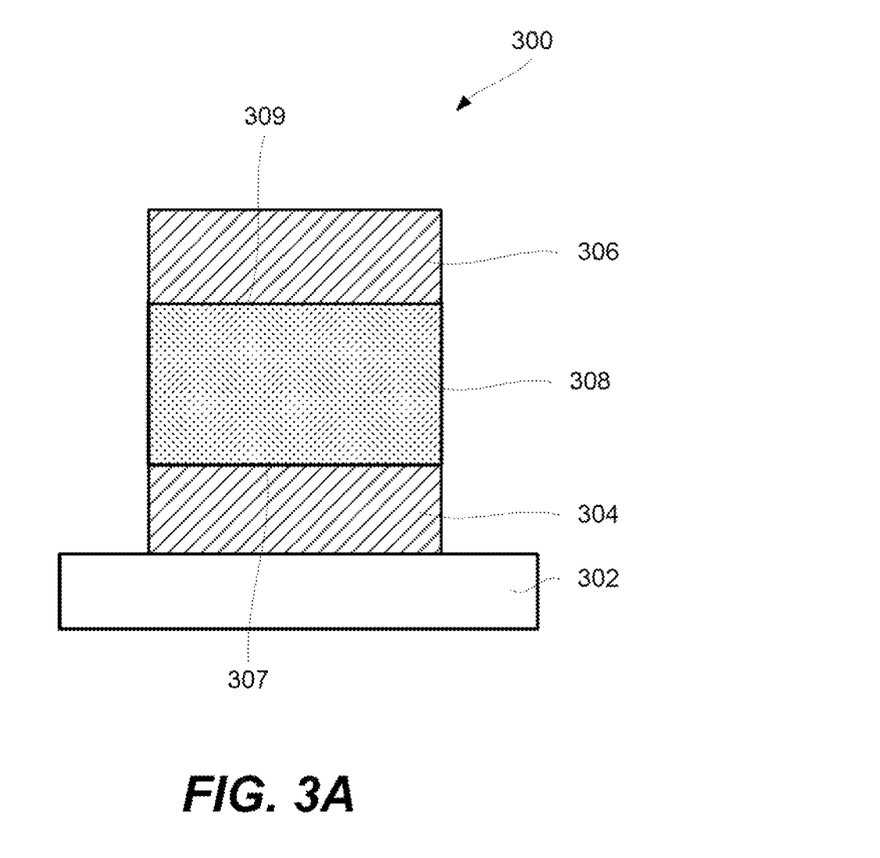
FIG. 3A illustrates a schematic representation of a ReRAM cell including a resistive switching layer having oxides of first and second elements, in accordance with some embodiments.

FIG. 3A is a schematic illustration of ReRAM cell 300, in accordance with some embodiments. ReRAM cell 300 may be disposed on substrate 302 that may include other ReRAM cells, layers, or structures (not shown in FIG. 3A). ReRAM cell 300 includes first electrode 304 and second electrode 306. In some embodiments, first electrode 304 and/or second electrode 306 extend laterally to connect to other ReRAM cells, for example, in a cross-bar arrangement further described below. ReRAM cell 300 also includes resistive switching layer 308. Resistive switching layer 308 is disposed between first electrode 304 and second electrode 306. Resistive switching layer 308 includes a first side 307 and a second side 309. The distance between first side 307 and second side 309 maybe referred to as a thickness of the resistive switching layer. In some embodiments, first side 307 directly interfaces with first electrode 304 and/or second side 309 directly interfaces with second electrode 306. Alternatively, other components may be disposed between resistive switching layer 308 and first electrode 304 and/or between resistive switching layer 308 and second electrode 306. Some of these other components may be embedded resistors, current steering elements, and the like. Each of these components will now be described in more detail.

Electrodes 304 and 306 provide electrical connections to ReRAM cell 300. For example, electrodes 304 and 306 may extend between multiple ReRAM cells, which may be cells provided in the same row or the same column of a memory array as further described below with reference to FIGS. 6A and 6B. Electrodes 304 and 306 may be made from conductive materials, such as n-doped polysilicon, p-doped polysilicon, titanium nitride, ruthenium, iridium, platinum, and tantalum nitride. Electrodes 304 and 306 may have a thickness of less than about 1,000 Angstroms, such as less than about 500 Angstroms and even less than about 100 Angstroms. Thinner electrodes may be formed using ALD techniques.

Resistive switching layer 308 can include a first element, a second element different from the first element, and oxygen. More specifically, resistive switching layer 308 may include an oxide of the first element (i.e., the first oxide) and an oxide of the second elements (i.e., the second oxide). Theses oxides may have different properties, such as different conductivities, different diffusion characteristics. For example, the first oxide may have a lower resistance than the second oxide. In some embodiments, the second oxide is an insulating oxide.

Figure 3B:
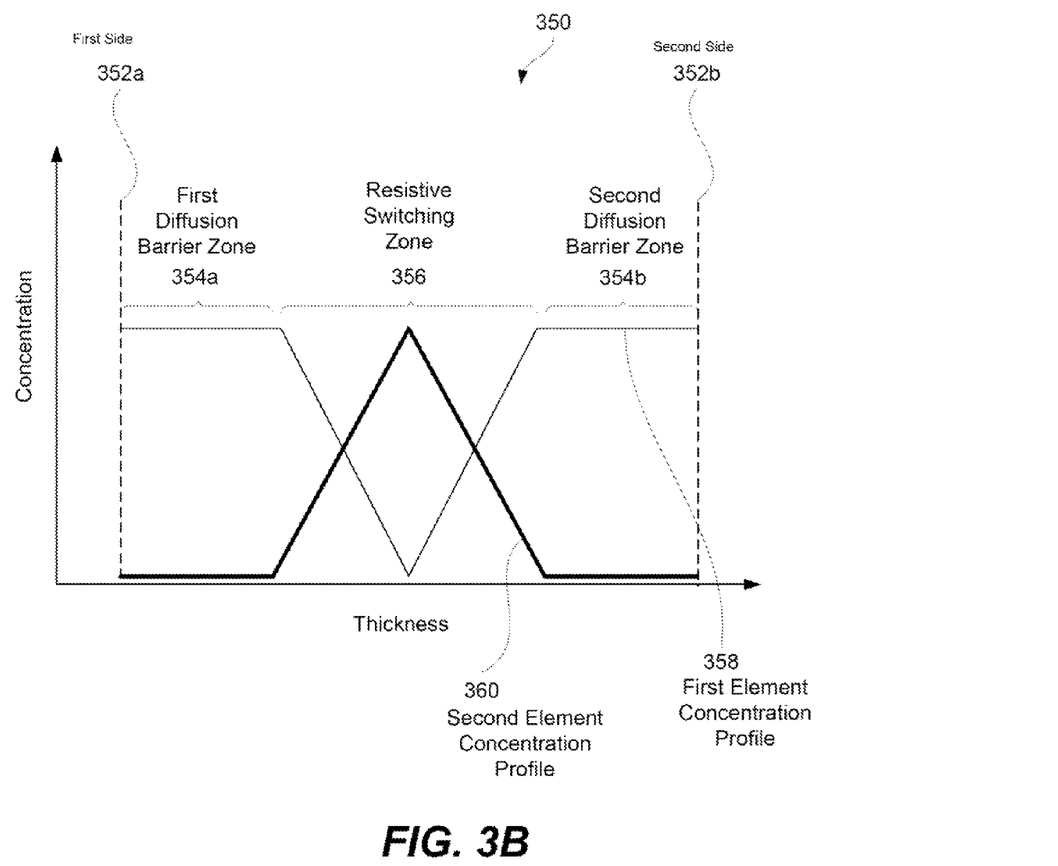
FIG. 3B is an illustrative plot of concentration profiles of two different elements in a resistive switching layer, in accordance with some embodiments.

In some embodiments, the first element may be one of hafnium, tantalum, titanium, zirconium, chromium, nickel, or cobalt. The second element forms an insulating oxide. The second element may be one of aluminum, silicon, germanium, sulfur, selenium, or gallium. The concentration of the first element and/or the second element may vary throughout the thickness of the resistive switching layer as will now be described with reference to FIG. 3B. Specifically, FIG. 3B illustrates a plot 350 of concentration profiles of two different elements of the resistive switching layer, in accordance with some embodiments. The concentration profiles are presented as a function of the position within the resistive switching layer. Dashed lines 352a and 352b represent different sides of the resistive switching layer. Line 358 corresponds to the concentration profile of the first element, while line 360 corresponds to the concentration profile of the second element.

The concentration of the first element may be the highest at each side of the resistive switching layer as, for example, shown in FIG. 3B by line 358. The zones where the concentration of the first element is the highest may be referred to as diffusion barrier zones 354a and 354b. Diffusion barrier zones 354a and 354b are separated by resistive switching zone 356 in which the concentration of the first element is less than in diffusion barrier zones 354a and 354b. Diffusion barrier zones 354a and 354b may be configured to prevent migration of different components into resistive switching zone 356 thereby ensuring consistent resistive switching properties of the ReRAM cell within resistive switching zone 356. For example, a titanium nitride electrode may be directly interfacing first side 352a or second side 352b. Titanium nitride can easily oxidize at interfaces with various oxides commonly used for resistive switching layers. For example, if not separated from the second oxide by a barrier such as the first oxide, titanium nitride can remove oxygen from the second oxide and shift the stoichiometric ratio of the second oxide to an undesirable level. However, when the first oxide is disposed between the titanium nitride and the second oxide, the second oxide remains relatively stable and maintains its stoichiometric ratio. As such, switching performance of the ReRAM cell remains the same.

The concentration of the second element may be lowest in diffusion barrier zones 354a and 354b. In some embodiments, diffusion barrier zones 354a and 354b are substantially free from the second element and are almost entirely formed from the first oxide. At the same time, the concentration of the second element may be highest in resistive switching zone 356. Specifically, the concentration of the second element in resistive switching zone 356 may form a peak similar to the one illustrated in FIG. 3B by line 360. This concentration peak of the second element may be located substantially in the middle of the resistive switching layer, i.e., half-way between first side 352a and second side 352b. This concentration peak defines the area where conductive filaments are formed and broken during resistive switching. The size of this area may also affect the required switching power; less power may be needed to form and break filaments in the smaller area. It should be noted that the conductive filaments are initially formed through the entire resistive switching layer including diffusion barrier zones 354a and 354b and resistive switching zone 356. However, during subsequent switching the conductive filaments are broken and reformed only in resistive switching zone 356, while portions of the conductive filaments in diffusion barrier zones 354a and 354b remain substantially unchanged.

Overall, the concentration of the first element may be lowest away from top and bottom sides of the resistive switching layer. This lowest concentration of the first element may coincide with the highest concentration of the second element. The average atomic ratio of the second element to the combination of the first element and the second element may be between about 5% and 30% or, more specifically, between about 10% and 20% in the entire resistive switching layer. However, the concentration of the second element may vary. In some embodiments, the concentration of the second element at top and bottom sides of the resistive switching layer is about 0% atomic. Limiting the amount of the second element allows reducing the size of the resistive switching zone and, as a result, reducing the required switching power. In some embodiments, the second element may be present only in less than about 50% of the resistive switching layer along a thickness of the resistive switching layer. The resistive switching layer may have a thickness of between about 3 nanometers and 5 nanometers.

Processing Examples

Figure 4:
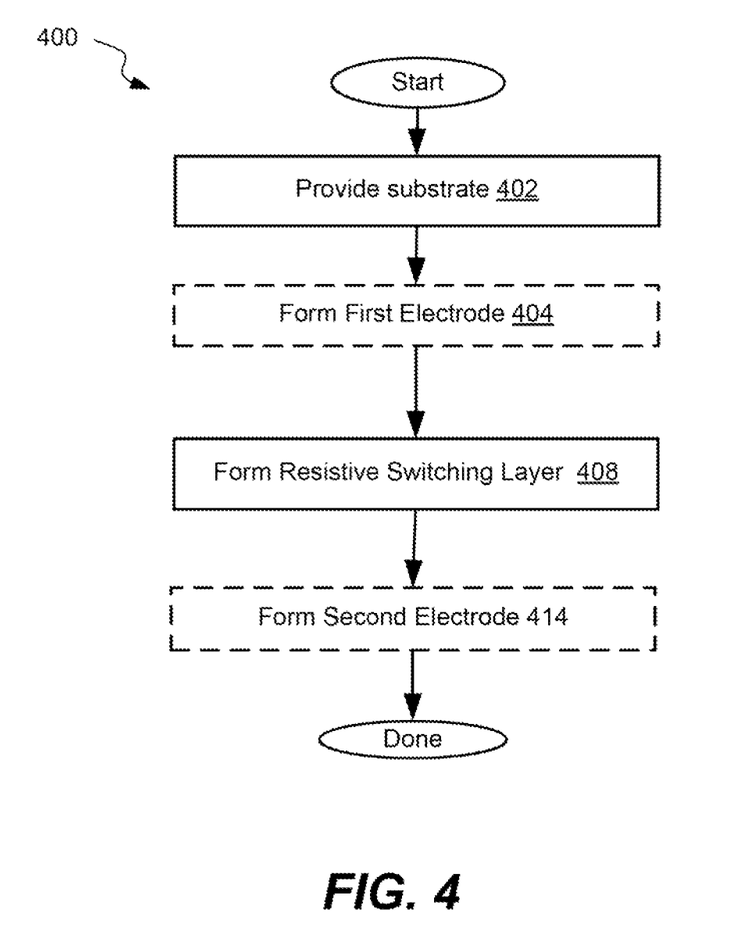
FIG. 4 illustrates a process flowchart corresponding to a method of fabricating a ReRAM cell using MOCVD formation of the resistive switching layer, in accordance with some embodiments.

FIG. 4 illustrates a process flow chart corresponding to method 400 of fabricating a resistive random access memory cell including an embedded resistor, in accordance with some embodiments. Method 400 may commence with providing a substrate during operation 402. In some embodiments, the substrate may include a first electrode and a resistive switching layer, in which case method 400 may proceed with forming a resistive switching layer during operation 408. Alternatively, method 400 may proceed with forming a first electrode on the substrate during optional operation 404 and then forming a resistive switching layer over the first electrode during operation 408.

In some embodiments, operation 404 may involve forming a titanium nitride electrode using sputtering. Deposition of the titanium nitride electrode may be performed using a titanium target in a nitrogen atmosphere maintained at a pressure of between about 1-20 mTorr. The power density may be maintained at 3.3-11 W/cm$^2$ (150-500 Watts on a 3" diameter target) that may result in a deposition rate of about 0.5-5 Angstroms per second (depending on the size of the target sample and other process parameters). Some of the provided process parameters are for illustrative purposes only and generally depend on deposited materials, tools, deposition rates, and other factors.

Operation 408 may involve forming a resistive switching layer using an MOCVD technique. The resistive switching layer formed during this operation includes a first element, a second element, and oxygen such that the first element is different form the second element. The first element may be supplied as a part of a first precursor or, more specifically, a first metal organic precursor. The second element may be supplied as a part of a second precursor or, more specifically, a second metal organic precursor. Overall, operation 408 may involve flowing the first metal organic precursor and flowing the second metal organic precursor into a MOCVD chamber. The flow rates of the first metal organic precursor and the second metal organic precursor may be dynamically varied while forming the resistive switching layer. This variation of the flow rates results in the variable concentrations of the first element and the second element in the resistive switching layer. The dynamic variation of the flow rates is performed while continuously forming the resistive switching layer. As such, at least one precursor may be constantly flowing into the deposition chamber during operation 408. The composition of precursors flowing into the chamber may change. In some embodiments, forming the resistive switching layer during operation 408 starts and ends with the second metal organic precursor not flowing into the MOCVD chamber. As such, the second element may not be present at either side of the resistive switching layer.

In some embodiments, the first metal organic precursor may not flow into the MOCVD chamber for a period time during operation 408. For example, operation 408 may start with flowing the first metal organic precursor into the chamber. Then the flow of the first metal organic precursor may be stopped for a period of time and then restarted. The first metal organic precursor may not flow into the chamber at the time when the second metal organic precursor flows into the MOCVD chamber.

In some embodiments, forming the resistive switching layer during operation 408 also involves flowing an oxidizing agent into the MOCVD chamber. The flow rate of the oxidizing agent may be dynamically varied while forming the resistive switching layer. For example, the flow rate of the oxidizing agent may be reduced when the second metal organic precursor flow into the MOCVD chamber in order, for example, to form a non-stoichiometric oxide of the second element.

In some embodiments, the first metal organic precursor and the second metal organic precursor flow into the MOCVD chamber at the same time for at least a period of time while forming the resistive switching layer. For example, operation 408 may start with flowing the first metal organic precursor into the chamber. The second metal organic precursor may not flow into the chamber at least initially. The flow rate of the first metal organic precursor may be then reduced, while the flow rate of the second metal organic precursor may be increased. As such, for a period of time, both precursors may flow into the chamber. At some point, the first metal organic precursor may stop flowing into the chamber and only the second metal organic precursor may flow in. Operation 408 may proceed with reducing the flow rate of the second metal organic precursor and reintroducing the first metal organic precursor into the chamber. Again, for another period of time, both precursors may flow into the chamber. At some point, the second metal organic precursor may stop flowing into the chamber and only the first metal organic precursor may flow in.

In some embodiments, forming a resistive switching layer is performed in a continuous manner. In other words, the substrate is not removed from the MOCVD chamber until the resistive switching layer is formed. Furthermore, one or more precursors may continuously flow into the MOCVD chamber while forming the resistive switching layer. The compositions of these precursors may change while forming the resistive switching layer. However, at least one or both of the precursors may be supplied into the chamber at all times during operation 408.

Examples of aluminum containing precursors include aluminum acetylacetonate ($Al(CH_3COCHCOCH_3)_3$), aluminum s-butoxide ($Al(OC_4H_9)_3$), aluminum ethoxide ($Al(OC_2H_5)_3$), aluminum hexafluoroacetylacetonate ($Al(CF_3COCHCOCF_3)_3$), aluminum isopropoxide ($Al[OCH(CH_3)_2]_3$), dimethylaluminum i-propoxide (($CH_3)_2Al(OC_3H_7)$), tri-i-butylaluminum (($C_4H_9)_3Al$), triethylaluminum (($C_2H_5)_3Al$). Examples of hafnium containing precursors include bis(cyclopentadienyl)dimethylhafnium (($C_5H_5)_2Hf(CH_3)_2$), hafnium t-butoxide ($Hf[OC(CH_3)_3]_4$), hafnium ethoxide ($Hf_4O(OC_2H_5)_{14}.2C_2H_5OH$), tetrakis(diethylamino)hafnium ($Hf[N(CH_2CH_3)_2]_4$), tetrakisdiethylaminohafnium ($Hf[N(CH_3)(CH_2CH_3)]_4$). Examples of silicon containing precursors include 3-aminopropyltriethoxysilane ($H_2N(CH_2)_3Si(OC_2H_5)_3$), tetrabutoxysilane ($Si(OC_4H_9)_4$), and tetraethoxysilane ($Si(OC_2H_5)_4$).

For example, a resistive switching layer including a hafnium oxide and aluminum oxide may be formed using tetrakisdiethylamidohafnium (TDEAH) and aluminum isopropoxide. Both precursors are liquid at room temperature (~25° C.) and have a moderate vapor pressure. The substrate temperature may be around 300-475° C. when depositing hafnium oxide and 200-450° C. when depositing aluminum oxide. In some embodiments, the substrate temperature may be maintained at a constant level during the entire operation 408. Alternatively, the temperature may vary during this operation.

Method 400 may proceed with forming a second electrode during operation 414. This operation would be understood by one having ordinary skills in the art and, in some embodiments, may the same as or similar to operation 404 described above.

Apparatus Examples

Figure 5:
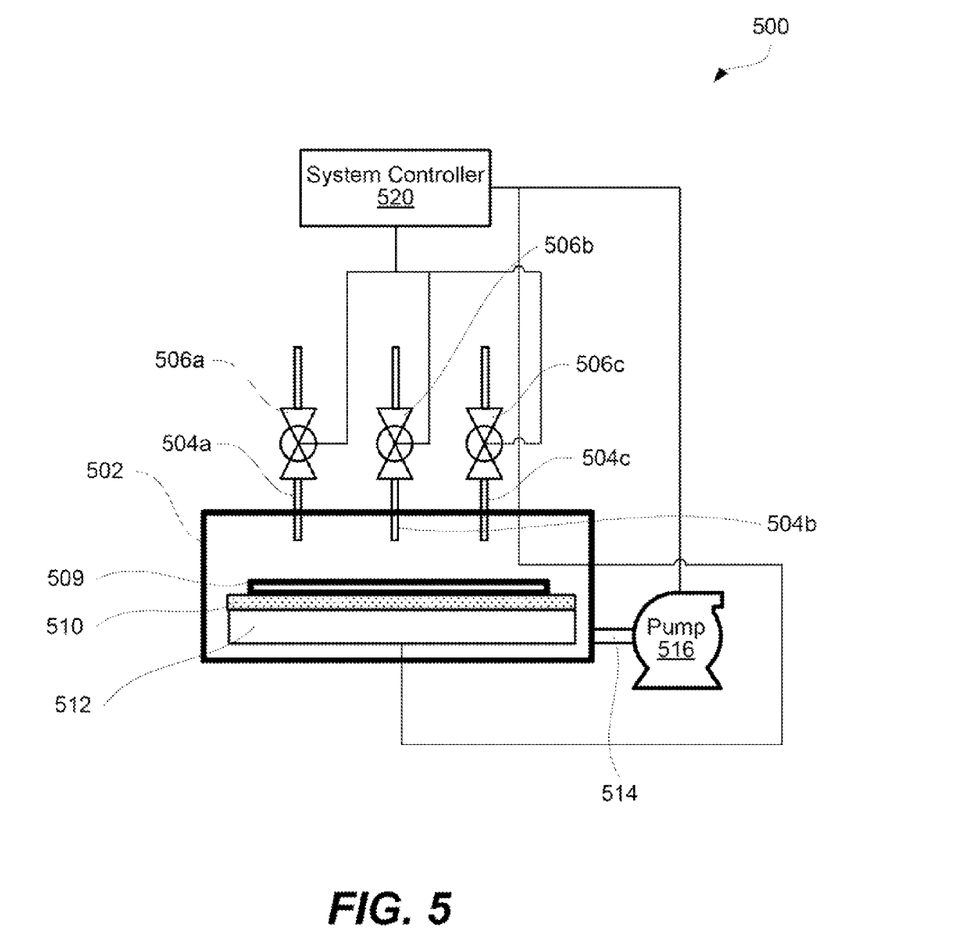
FIG. 5 illustrates a schematic representation of a MOCVD apparatus for fabricating ReRAM cells, in accordance with some embodiments.

FIG. 5 is a schematic diagram of a MOCVD apparatus 500, in accordance with some embodiments. MOCVD apparatus 500 includes a deposition chamber 502 configured to receive and to enclose a substrate 509 during deposition of various layers on substrate 509. Specifically, substrate 509 may be supported by a susceptor 510 that may be coupled to a heater 512. A combination of susceptor 510 and heater 512 may be designed to maintain the temperature of substrate 509 at a desired level as specified above. Heater 512 may provide inductive heating, radiation heating, resistive heating, and/or other forms of heating. Furthermore, susceptor 510 or the combination of susceptor 510 and heater 512 may be used to rotate substrate 509 relative to gas delivery lines 504a-504c to ensure uniform gas concentrations on the substrate surface. Heater 512 and/or susceptor 510 may be controlled by system controller 520 to ensure desirable temperature of substrate 509 as well as desirable position and/or motion of substrate 509 relative to gas delivery lines 504a-504c.

While substrate 509 is heated to a certain processing temperature to stimulate a chemical reaction on the surface, components of MOCVD apparatus may be kept cold to prevent this reaction on the surfaces of these components. For example, walls of deposition chambers may be coupled to a heat exchanger to control the temperature of the walls.

One or more delivery lines 504a-504c may extend into the chamber for delivering precursors (e.g., metal organic precursors), oxidizing agents, other reagents, inert gases, and other components. While FIG. 5 illustrates three delivery lines 504a-504c, any number of lines may be used and within the scope of this disclosure. In some embodiments, one or more precursors may be delivered using the same line. The flow in each delivery line may be controlled using one of valves and/or mass flow controllers 506a-506c. Operation of valves 506a-506c may be controlled by system controller 520. Delivery lines 504a-504c may be separated so that the reactive gases do not react until they reach the substrate surface.

The reaction products, unreacted precursors, and purge gases are removed from deposition chamber 502 through an exhaust line 514 using, for example, vacuum pump 516.

Vacuum pump 516 may be controlled by system controller 520 in order to maintain a desired pressure level inside deposition chamber 502.

Apparatus 500 may include system controller 520 for controlling process conditions during formation of various ReRAM components, such as resistive switching layers, and other processes. Controller 520 may include one or more memory devices and one or more processors with a CPU or computer, analog and/or digital input/output connections, stepper motor controller boards, etc. In some embodiments, controller 520 executes system control software including sets of instructions for controlling timing, gas flows, chamber pressure, chamber temperature, substrate temperature, and other parameters. Other computer programs and instruction stored on memory devices associated with controller may be employed in some embodiments.

Memory Array Examples

Figure 6A:
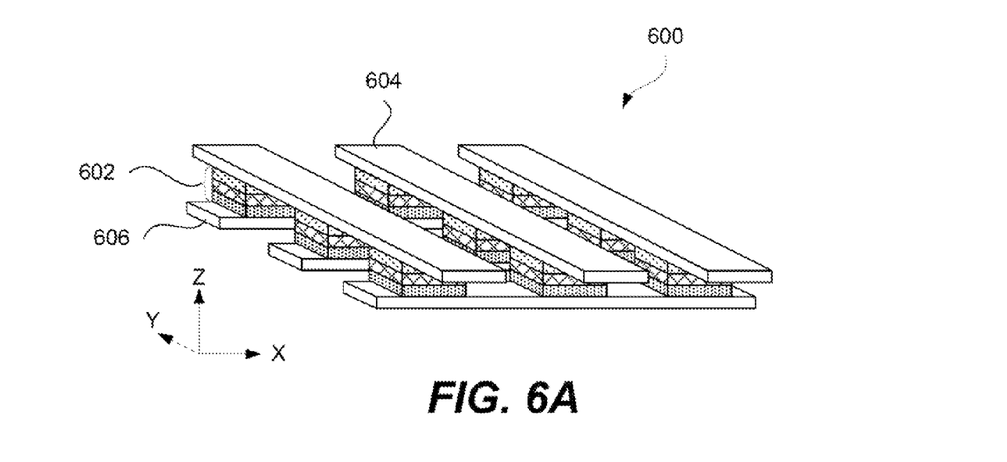
FIGS. 6A and 6B illustrate schematic views of memory arrays including multiple ReRAM cells, in accordance with some embodiments.

A brief description of memory arrays will now be described with reference to FIGS. 6A and 6B to provide better understanding of various aspects of structures provided adjacent to ReRAM cells and, in some examples, surrounding the ReRAM cells. ReRAM cells described above may be used in memory devices or larger integrated circuits (IC) that may take a form of arrays. FIG. 6A illustrates a memory array 600 including nine ReRAM cells 602, in accordance with some embodiments. In general, any number of ReRAM cells may be arranged into one array. Connections to each ReRAM cell 602 are provided by signal lines 604 and 606, which may be arranged orthogonally to each other. ReRAM cells 602 are positioned at crossings of signal lines 604 and 606 that typically define boundaries of each ReRAM cell in array 600.

Signal lines 604 and 606 are sometimes referred to as word lines and bit lines. These lines are used to read and write data into each ReRAM cell 602 of array 600 by individually connecting ReRAM cells to read and write controllers. Individual ReRAM cells 602 or groups of ReRAM cells 602 can be addressed by using appropriate sets of signal lines 604 and 606. Each ReRAM cell 602 typically includes multiple layers, such as top and bottom electrodes, resistive switching layer, embedded resistors, embedded current steering elements, and the like, some of which are further described elsewhere in this document. In some embodiments, a ReRAM cell includes multiple resistive switching layers provided in between a crossing pair of signal lines 604 and 606.

As stated above, various read and write controllers may be used to control operations of ReRAM cells 602. A suitable controller is connected to ReRAM cells 602 by signal lines 604 and 606 and may be a part of the same memory device and circuitry. In some embodiments, a read and write controller is a separate memory device capable of controlling multiple memory devices, each one containing an array of ReRAM cells. Any suitable read and write controller and array layout scheme may be used to construct a memory device from multiple ReRAM cells. In some embodiments, other electrical components may be associated with the overall array 600 or each ReRAM cell 602. For example, to avoid the parasitic-path-problem, i.e., signal bypasses by ReRAM cells in their low resistance state (LRS), serial elements with a particular non-linearity must be added at each node or, in some embodiments, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, in some embodiments, embedded into each cell to decouple the cell if it is not addressed. This approach significantly reduces crosstalk in the matrix of the memory device.

Figure 6B:
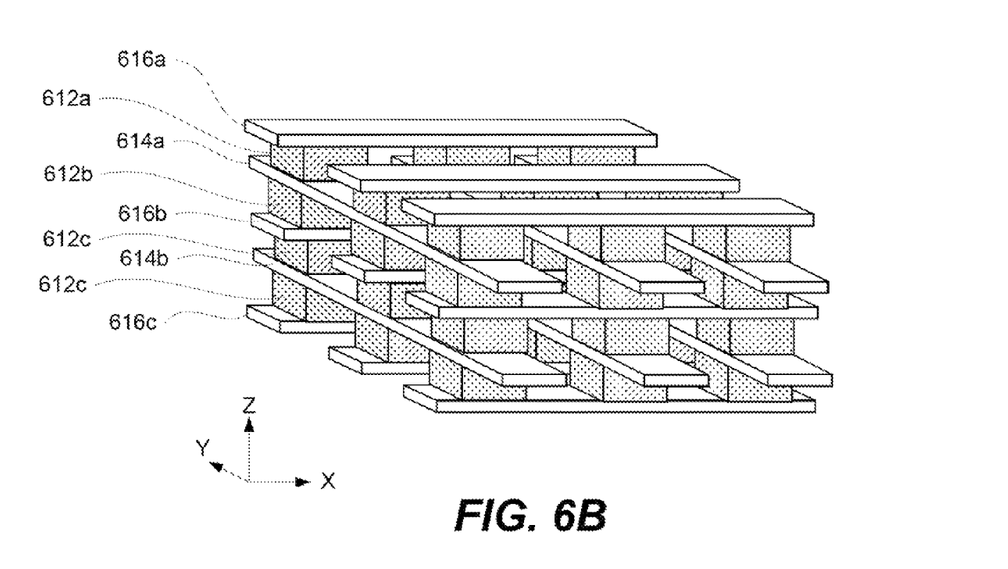

In some embodiments, a memory device may include multiple array layers as, for example, illustrated in FIG. 6B. In this example, five sets of signal lines 614a-b and 616a-c are shared by four ReRAM arrays 612a-c. As with the previous example, each ReRAM array is supported by two sets of signal lines, e.g., array 612a is supported by 614a and 616a. However, middle signal lines 614a-b and 616b, each is shared by two sets of ReRAM arrays. For example, signal line set 614a provides connections to arrays 612a and 612b. Top and bottom sets of signal lines 616a and 616c are only used for making electrical connections to one array. This 3-D arrangement of the memory device should be distinguished from various 3-D arrangements in each individual ReRAM cell.

Conclusion

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method of fabricating a resistive random access memory cell, the method comprising:
 providing a substrate having a conductive layer operable as an electrode; and
 forming a resistive switching layer over the conductive layer;
  wherein the resistive switching layer is formed using metal organic chemical vapor deposition; and
  wherein the resistive switching layer comprises a first element, a second element, and oxygen, wherein a concentration of the first element varies throughout a thickness of the resistive switching layer.

2. The method of claim 1, wherein the first element comprises a transition metal.

3. The method of claim 1, wherein the second element forms an insulating oxide.

4. The method of claim 1, wherein the first element comprises one of hafnium, tantalum, titanium, zirconium, chromium, nickel, or cobalt, and wherein a concentration of the first element is lowest away from top and bottom sides of the resistive switching layer.

5. The method of claim 4, wherein the second element comprises one of aluminum, silicon, germanium, sulfur, selenium, or gallium, and wherein a concentration of the second element varies throughout a thickness of the resistive switching layer.

6. The method of claim 5, wherein the concentration of the second element is highest in the resistive switching layer at a location where the concentration of the first element is lowest.

7. The method of claim 5, wherein an atomic ratio of the second element to a combination of the first element and the second element is between about 10% and 20%.

8. The method of claim 5, wherein the resistive switching layer comprises one of hafnium silicon oxide, hafnium aluminum oxide, tantalum silicon oxide, or tantalum aluminum oxide.

9. The method of claim 1, wherein a concentration of the second element at top and bottom sides of the resistive switching layer is about 0% atomic.

10. The method of claim 9, wherein the second element is present only in less than about 50% of the resistive switching layer along a thickness of the resistive switching layer.

11. The method of claim 1, wherein forming the resistive switching layer comprises flowing a first metal organic precursor and flowing a second metal organic precursor into a metal organic chemical vapor deposition chamber, the first metal organic precursor comprising the first element, the second metal organic precursor comprising the second element, and wherein flow rates of the first metal organic precursor and the second metal organic precursor are dynamically varied while forming the resistive switching layer.

12. The method of claim 11, wherein forming the resistive switching layer starts and ends with the second metal organic precursor not flowing into the metal organic chemical vapor deposition chamber.

13. The method of claim 11, wherein the first metal organic precursor does not flow into the metal organic chemical vapor deposition chamber for a period time while the second metal organic precursor flows into the metal organic chemical vapor deposition chamber.

14. The method of claim 11, wherein forming the resistive switching layer further comprises flowing an oxidizing agent into the metal organic chemical vapor deposition chamber, wherein a flow rate of the oxidizing agent is dynamically varied while forming the resistive switching layer.

15. The method of claim 14, wherein the flow rate of the oxidizing agent is reduced when the second metal organic precursor flow into the metal organic chemical vapor deposition chamber.

16. The method of claim 11, wherein the first metal organic precursor and the second metal organic precursor flow into the metal organic chemical vapor deposition chamber at the same time for at least a period of time while forming the resistive switching layer.

17. The method of claim 1, wherein the resistive switching layer has a thickness of between about 3 nanometers and 5 nanometers.

18. The method of claim 1, wherein the substrate is not removed from the MOCVD chamber until the resistive switching layer is formed.

19. A method of fabricating a resistive random access memory cell, the method comprising:
   providing a substrate comprising a conductive layer operable as an electrode, the substrate being at a temperature of between about 300° C. and 450° C.; and
   forming a resistive switching layer over the conductive layer, wherein forming comprises
      (a) flowing tetrakisdiethylamidohafnium and an oxidizing agent into a metal organic chemical vapor deposition chamber;
      (b) after (a), reducing a flow rate of tetrakisdiethylamidohafnium and increasing a flow rate of aluminum isopropoxide; and
      (c) after (b), increasing the flow rate of tetrakisdiethylamidohafnium and stopping the of aluminum isopropoxide.

* * * * *